United States Patent
Ehrichs

(10) Patent No.: US 7,223,615 B2
(45) Date of Patent: May 29, 2007

(54) HIGH EMISSIVITY CAPACITOR STRUCTURE

(75) Inventor: Edward E. Ehrichs, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 341 days.

(21) Appl. No.: 10/402,166

(22) Filed: Mar. 26, 2003

(65) Prior Publication Data
US 2004/0188801 A1  Sep. 30, 2004

(51) Int. Cl.
 H01L 21/00 (2006.01)
 H01L 21/8242 (2006.01)
 H01L 21/265 (2006.01)

(52) U.S. Cl. .................. 438/13; 438/18; 438/253; 438/522; 438/530; 438/663

(58) Field of Classification Search .................. None
See application file for complete search history.

(56) References Cited

U.S. PATENT DOCUMENTS

| | | | |
|---|---|---|---|
| 6,087,245 A | 7/2000 | Yamazaki et al. | |
| 6,500,704 B1 | 12/2002 | Hirano et al. | |
| 6,737,319 B2 * | 5/2004 | Morimoto et al. | 438/253 |
| 2002/0061661 A1 | 5/2002 | Dairiki | |

FOREIGN PATENT DOCUMENTS

| EP | 63114135 | 5/1988 |
|---|---|---|
| EP | 10026772 | 7/1996 |
| EP | 2000138177 | 5/2000 |
| EP | 1104934 A2 | 6/2001 |

\* cited by examiner

*Primary Examiner*—Hung Vu

(57) ABSTRACT

The present invention is directed to controlling wafer temperature during rapid thermal processing. Regions and devices in an integrated circuit may be surrounded, inlayed, and overlaid with high absorptive structures to increase the average absorptivity of a region. This technique is useful for increasing average absorptivity in dense capacitive regions of integrated circuits. These dense capacitive regions typically have large areas of exposed low absorptivity polysilicon during rapid thermal processing steps. The exposed low absorptivity regions absorb less energy than other regions of the integrated circuit. As such, the RTP temperature varies between regions of the integrated circuit, causing variance in device size and characteristics. Adding absorptivity structures increase the absorption of energy in these regions, reducing temperature variance during RTP. The reduced temperature variance results in uniform manufacture of device.

21 Claims, 5 Drawing Sheets

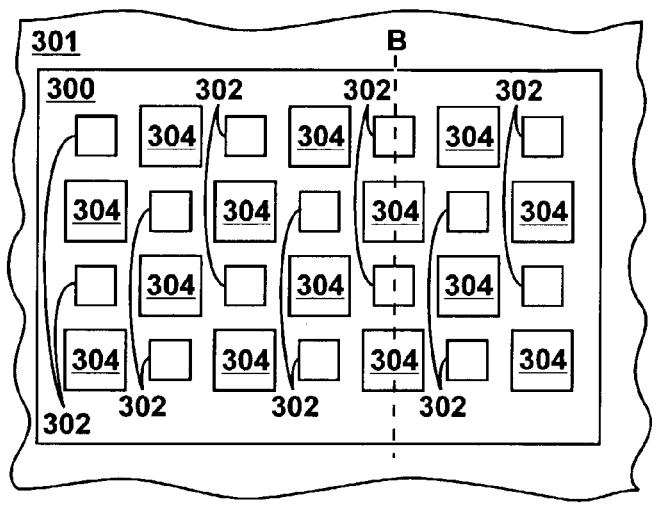
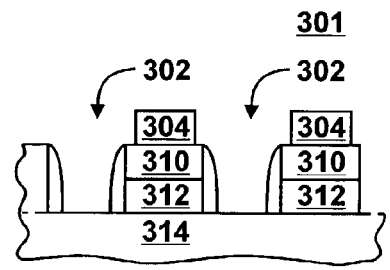
FIG. 8A  FIG. 8B
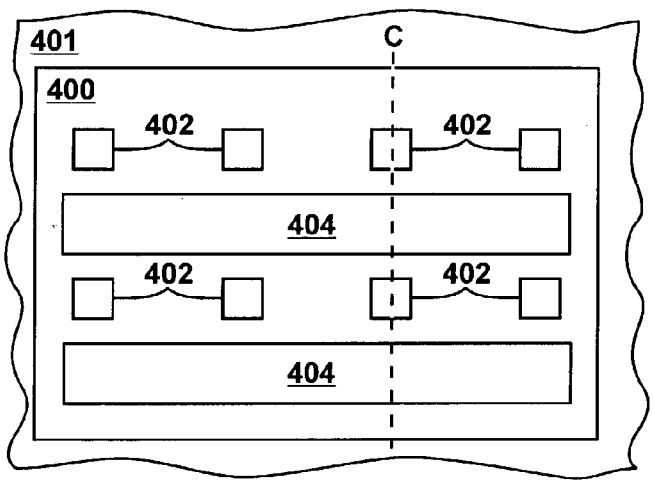
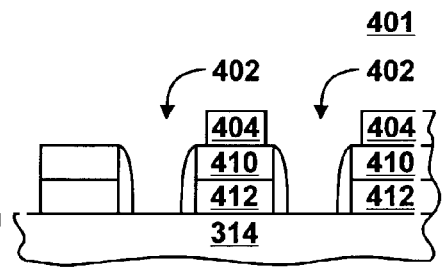
FIG. 9A  FIG. 9B
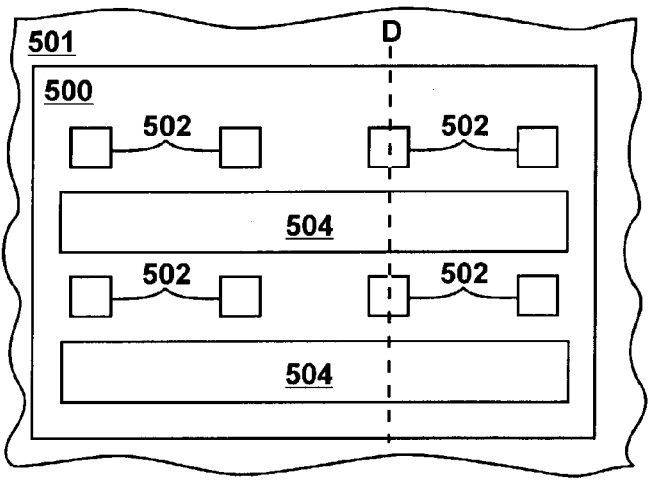
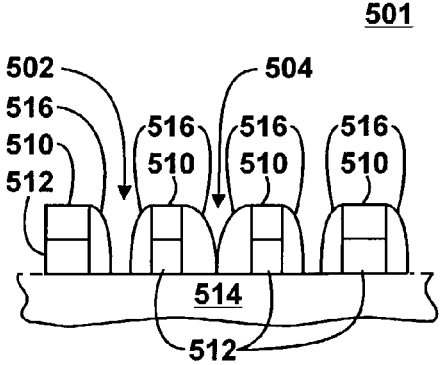
FIG. 10A  FIG. 10B

HIGH EMISSIVITY CAPACITOR STRUCTURE

BACKGROUND

In the Semiconductor industry, Rapid Thermal Processing (RTP) is used to influence diffusion of dopants into silicon and other substrates. Such processing is used to produce doped regions having appropriate thickness and conductive characteristics. Since reaction rates and diffusion rates are a function of temperature, control of temperature affects the performance of devices manufactured as integrated circuits. If the temperature on one region of the device differs from that of another region of the device, the behavior of circuits in those differing regions can have different performance characteristics.

Control of performance characteristics is relatively more important for small featured devices, such as those having 0.13 µm features or less, than for larger featured devices. For example, temperature influences activation of source/drain implants which affects transistor leakage, device size, and ultimately, clock speed. Depending on the specific process, each 1° C. of temperature variation across the device can change the L-effective of the device by as much as 1 nm or more.

A typical Rapid Thermal Anneal (RTA) may raise the temperature of a wafer to 950–1200° C. in less than a minute. This process is often performed with Tungsten Halogen lamps, which direct light onto the surface of the wafer. The surface material then absorbs the energy to varying extents depending on the absorptivity of the surface material. Higher absorptivity materials absorb more energy and thus heat faster than lower absorptivity materials. Because of the varied surface materials on a semiconductor device, the temperature at a location within the wafer can be dependent on the absorptivity of nearby materials.

The design of very large-scale integrated circuits often utilizes automated algorithms for presenting a design layout. Often these algorithms determine positioning of transistors about an integrated circuit based on timing considerations assuming a common transistor performance. After transistor placement, remaining space can be filled with relatively large capacitors, as needed. During manufacture, these areas with large capacitors typically have large dense areas of polysilicon while transistor dense areas have less dense arrangements of polysilicon. Polysilicon is a low absorptivity material. Therefore, regions with high polysilicon surface density absorb less energy and heat slower than the lower density polysilicon areas. For this reason, maintaining minimal temperature variance across the circuit is difficult during rapid thermal processes (RTP). Regions about the capacitors absorb less energy and thus have lower temperatures than other regions of the integrated circuit. The problem of having varied temperatures across a circuit is especially troublesome for Semiconductor-On-Insulator circuits having buried oxide (BOX) layers that are also poor conductors. With poor thermal conduction under the capacitors due to the BOX layers, thermal energy in one region of the wafer is insulated from spreading efficiently to other regions and thereby reducing the affects of varied surface absorptivity.

The rapid nature of the temperature increase during RTA prevents traditional temperature control methods such as slower temperature ramping from being employed. Slower temperature ramping more closely matches thermal conduction time and length scales. However, slow temperature ramping fails to produce the desired device characteristics and increases manufacturing time.

As such, many typical wafer designs suffer from deficiencies in uniform processing temperatures and thus uniform performance. Other problems and disadvantages of the prior art will become apparent to one skilled in the art after comparing such prior art with the present disclosure as described herein.

FIELD OF THE INVENTION

This disclosure, in general, relates to a semiconductor manufacturing process. More specifically, this disclosure relates to controlling temperatures during various manufacturing steps.

BRIEF DESCRIPTION OF THE DRAWINGS

For a more complete understanding of the present invention and advantages thereof, reference is now made to the following description taken in conjunction with the accompanying drawings in which like reference numbers indicate like features and wherein:

FIGS. 8A, 8B, 9A, 9B, 10A, and 10B depict various views of exemplary embodiments of layered devices.

DETAILED DESCRIPTION

The present disclosure utilizes structures of differing absorptivity or emissivity to compensate for variances in average absorptivity across regions of the integrated circuitry. Polysilicon and similar substances have low absorptivity and thus absorb less energy from lamps than high absorptivity material such as silicon nitride, silicon dioxide, and other materials. Regions of an integrated circuit over which much of the surface is polysilicon will absorb less energy and be cooler during rapid thermal processing (RTP) than regions having less polysilicon surfaces or more surfaces of high absorptivity. The lower temperature in the high-density polysilicon regions will alter device characteristics in those regions differently than devices in regions with higher temperatures. The structures of the present disclosure act to adjust the average absorptivity of a given region to more closely match that of other regions. In this manner, the temperature variance across the circuit may be reduced, allowing a more consistent device performance achieved.

Figure 1:
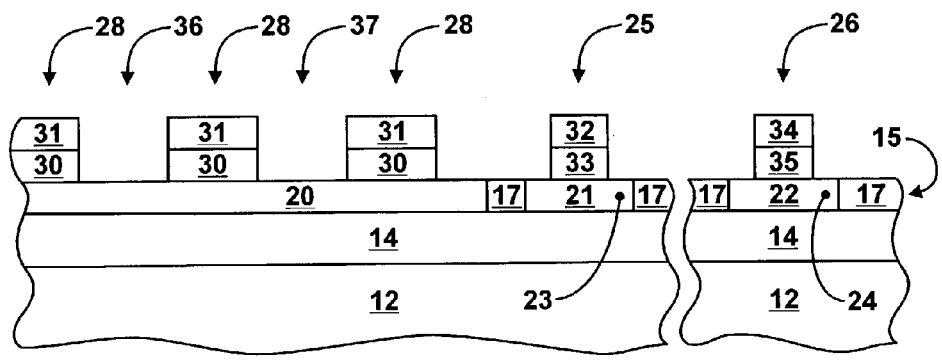
FIG. 1 is a side view of an exemplary layered device.

FIG. 1 depicts an exemplary portion of a semiconductor wafer integrated circuit during a manufacturing process. The specific semiconductor wafer illustrated is a Semiconductor-On-Insulator wafer has a bulk substrate 12, a buried oxide (BOX) layer 14, and a semiconductor layer 15. Semiconductor devices are manufactured in and/or over the semiconductor layer 15. The bulk substrate layer 12 and semiconductor layer 15 can comprise silicon but may alternatively comprise gallium arsenide, germanium, and other suitable substrates. The insulation layer 14 can comprise silicon dioxide but may comprise sapphire, silicon nitride, other insulating forms of silicon, or other variations of base substrates. In addition, bulk semiconductor wafers, such as silicon and gallium arsenide wafers, may be used.

Integrated into and overlying the semiconductor layer 15 are devices 28, 25, and 26. Device 28 represents a capacitor with an upper conductive portion 31, an insulation layer 30 and a lower conductive portion 20. The device 28 is illustrated to have contact openings 36 and 37. The conductive portion 20 is formed into the semiconductor layer 15 and will typically comprise doped silicon. The insulation layer 30 will typically comprise an oxide such as silicon dioxide or a nitride such as silicon nitride, or other insulators. The upper conductive portion 31 typically comprises polysilicon but may comprise other conductive materials.

Device 25 represents a transistor located in relatively close proximity to the capacitor device 28. Device 25 comprises a conductive gate layer 32 overlaying a gate dielectric layer 33 that overlies a potion of the active region 21. The active region 21 is separated from other active regions by isolation regions 17.

Device 26 represents a transistor located further away from the capacitor device 28 than transistor 25. Similar to device 25, device 26 has a conductive gate layer 34 overlying a gate dielectric layer 35 that overlies a portion of the active region 22. The active region 22 is separated from other active regions by isolation regions 17.

If an RTA were performed on the devices as described above, exposed polysilicon layers such as layer 31 would absorb less energy than other layers such as the exposed active regions 20–22 and the isolation region 17. Therefore those portions of the wafer of FIG. 1 with higher concentrations of polysilicon surface structures will heat slower and have a lower temperature than those portions of the wafer with lower concentrations of polysilicon surface structures or higher concentrations of surface structures with higher absorptivity. For example, the region near the capacitor 28, which includes transistor device 25, can have a lower temperature than other regions of the integrated circuit during RTA because the capacitor has large surface areas of exposed polysilicon. As a result, transistor 25 located in close proximity to capacitor 28 will be cooler than transistor 26 during RTA. For example, the difference in absorptivity of the polysilicon versus other surface materials causes an exemplary point 23 to have a significantly different temperature than a point 24 near device 26. This difference in temperature can result in activation differences between device 25 and device 26. This activation difference can result in different transistor characteristics such as transistor leakage, junction depth, and drive current, among other characteristics. As such, transistors 25 and 26 may perform at different clock speeds, resulting in device timing errors.

Figure 2:
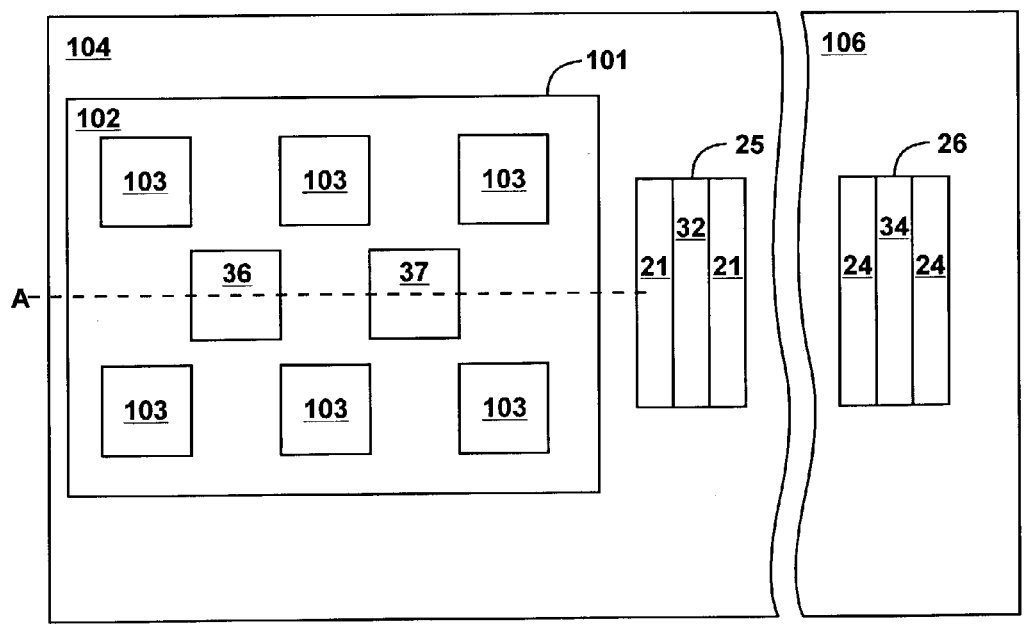
FIG. 2 is an overhead view of the device seen in FIG. 1.

FIG. 2 depicts an overhead view of the integrated circuit portion of FIG. 1. Line A indicates the location of a slice that would approximate the side view of FIG. 1. A capacitor 101 located on the integrated circuit has contact openings 103, 36 and 37 and a large polysilicon surface 102. Surface 31 of FIG. 1 is a portion of surface 102. The large polysilicon surface area 102 has a lower absorptivity and emissivity than other surfaces about the integrated circuit. Therefore, the surface 102 will absorb energy from heat lamps slower than other regions and surfaces about the circuit. As such, the area 104 close to capacitor 101 can have a slower rate of temperature increase than area 106 located further away from the capacitor 101. This difference in temperature rate leads to differences in temperature experienced by device 25 and device 26 during RTA. As a result, devices 25 and 26 can have different device characteristics.

Figure 3:
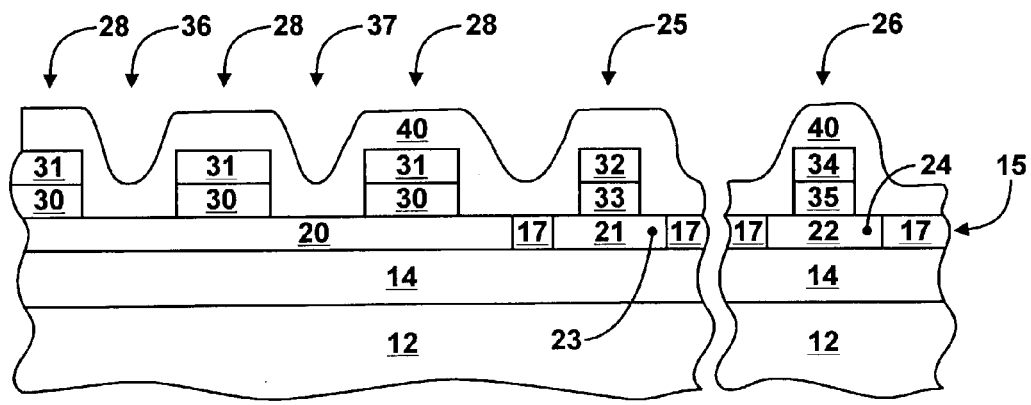
FIGS. 3 and 4 depict side views of an exemplary layered device.

To alter the absorptivity of a region of the integrated circuit, an absorptive material may be formed as shown in FIG. 3, which depicts an absorptivity layer 40 formed over the devices of FIG. 1. This absorptivity layer 40 may comprise silicon nitride, $SiO_2$, and SION (silicon oxynitride).

Figure 4:
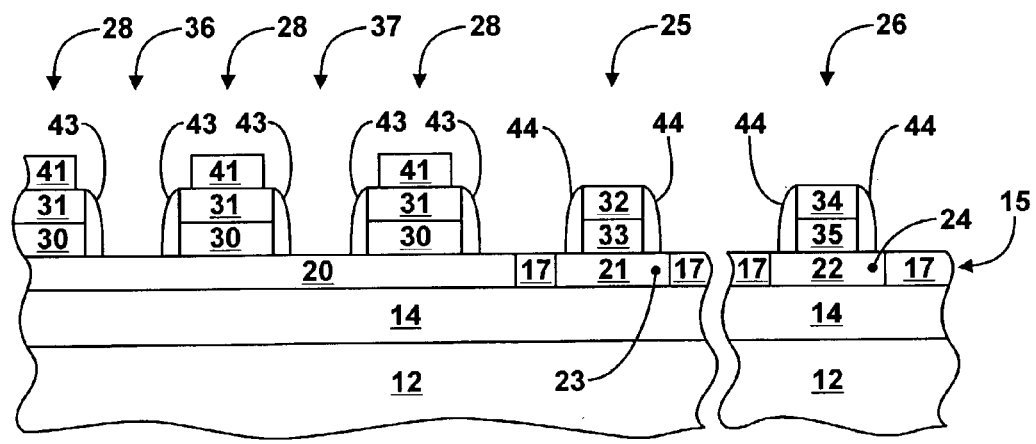

FIG. 4 illustrates structures 41, 43, and 44 formed from layer 40, following masking and etch steps. The structures 44 are sidewall structures that aid in the formation of transistor source drain regions. The structures 43 are typically found at the same time as structures 44, and aid in isolating the upper capacitor portions from the lower capacitor portions 20 if a conductive contact (not shown) is formed. The isolation structures 43 can be chosen to have a higher absorptivity than the device portions they overlie to increase the amount of energy absorption. Assuming structures 43 have a higher absorptivity than the underlying semiconductor, increasing the size (e.g., width) of these isolation structures 43 further increases the average absorptivity of its local region.

The structures 41 are absorptivity structures that overlay low absorptivity material surfaces. The absorptivity structures allow the average absorptivity of these local regions to be increased. The proportion of surface area comprising higher absorptivity material may be controlled to obtain a desired average absorptivity of the region. Note a region can be defined by a device's boundaries. In one embodiment, controlling the position of high absorptivity material will allow the average absorptivity to be approximately uniform across the device, allowing each region of the integrated circuit to absorb energy at approximately the same rate, thereby heating to approximately the same temperature. The consistent temperature results in more uniform device characteristics across a semiconductor device, such as transistors.

Figure 5:
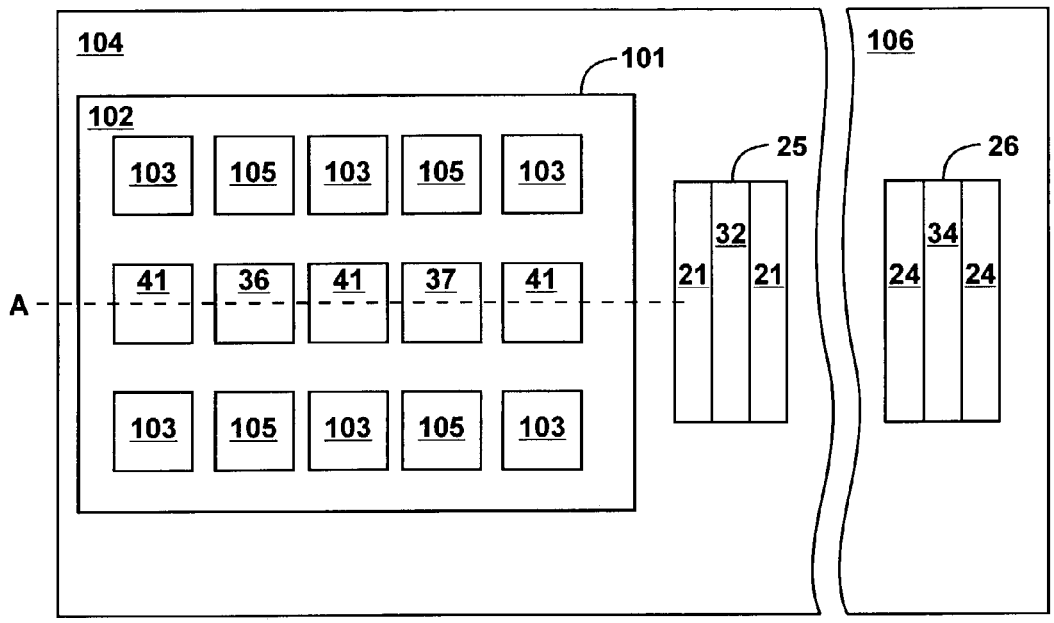
FIG. 5 is a top view of the device as seen in FIG. 4.

FIG. 5 depicts a top view of the exemplary embodiment seen in FIG. 4. The capacitor 101 includes contact openings 103, 36, and 37 formed within a low absorptivity surface 102 that is overlaid with higher absorptivity structures 105 and 41. The structures 105 and 41 are selected to allow the absorptivity of region 104 to match that of region 106. Note, region 104 includes the capacitor 101 and nearby portions affected by the low absorptivity of the capacitor 101. The matching absorptivity between regions 104 and 106 reduces temperature differences across the integrated device. Therefore, exemplary devices 25 and 26 will activate with similar characteristics, allowing for more uniform device operation.

Figure 6:
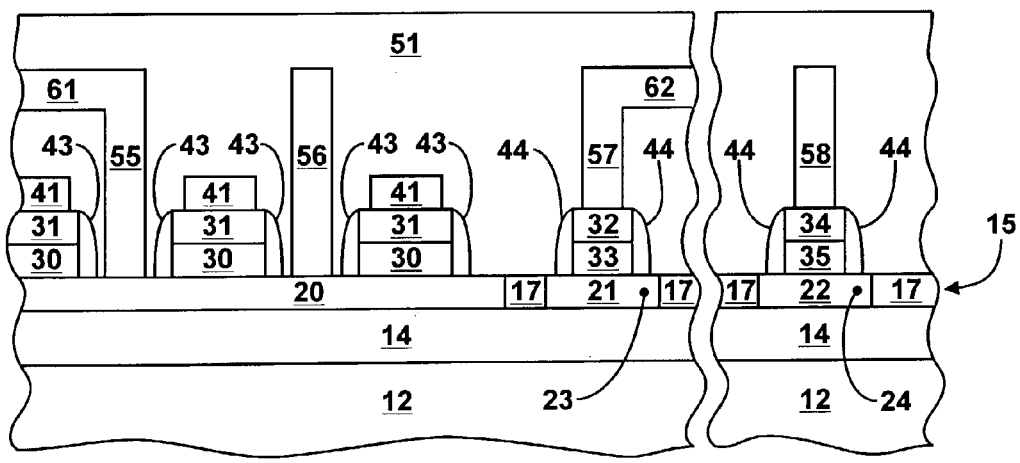
FIGS. 6 and 7 illustrate side views of an exemplary layered device.

The absorptivity structures 105 may subsequently be removed or left on the device. In general, these structures will be inert and not affect finished device performance by their presence. FIG. 6 depicts a finished integrated circuit with contacts 55, 56, 57 and 58 and conductive traces 61 and 62. The contacts (55, 56, 57, and 58) and conductive traces (61 and 62) are enclosed in a dielectric material 51. As shown in this example, the absorptive structures 41 are left in place, while absorptive structures 43 act to isolate device layers from contacts 55, and 56.

Figure 7:
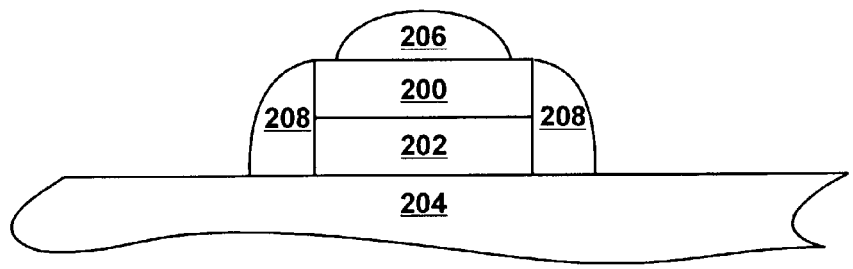

FIG. 7 depicts a single exemplary device structure. The device structure resides on an active substrate layer 204. The device may have several layers including an insulating layer 202 and a semiconductor layer 200. If the semiconductor layer 200 has an absorptivity that alters the average absorptivity from that of other regions of the integrated circuit, additional absorptivity elements 206 or 208 may be placed about the device. The additional absorptivity elements, 206 or 208, act to adjust the average absorptivity of the region such that it approximates the average absorptivity of other regions.

One absorptivity element 206 is located over layers having undesired absorptivity characteristics. The element 206 may be a high absorptivity structure to increase the average absorptivity of the region. Alternately, the element 206 may be a low absorptivity structure to decrease the absorptivity of the region. Another absorptivity structure 208 may connect to and be located on the side of layers 200 and 202. These absorptivity structures 208 may also act to isolate or insulate device layers from subsequently formed structures. Increasing the surface area of these structures 208 increases the influence of the structures' 208 absorptivity on the average absorptivity of the region on which they reside. Therefore, one embodiment includes decreasing the density of device placement, leaving more room for the deposition of absorptive material between devices.

FIGS. 8A and 8B depict a top and side view of an exemplary device 301, respectively. A capacitor 300 is part of a device 301. The top view seen in FIG. 8A shows contact openings 302 interspersed with absorptivity structures 304 on the capacitor 300. FIG. 8B illustrates a side view of the capacitor 300 at a location indicated by Line B seen in FIG. 8A. The capacitor 300 comprises an upper conductive portion 310, an insulation layer 312, and a lower conductive portion 314. Isolation structures 316 allow for contact with the lower conductive portion 314 while isolating layers 310 and 312. The absorptivity structures 304 are located above the device layers, covering surfaces having a different absorptivity. In addition, absorptive structures that act as insulative sidewalls can also surround contact openings 302.

FIGS. 9A and 9B depict an alternate structure of capacitor 400 that is part of a device 401. In this example, absorptivity structures 404 may be placed between rows of contact openings 402. FIG. 9A show a top view of the structure. FIG. 9B depicts a side view at a location indicated by Line C on FIG. 9A. The capacitor 400 comprises an upper conductive portion 410, an insulation layer 412, and a lower conductive portion 414. Isolation structures 416 allow for contact with the lower conductive portion 314 while isolating layers 310 and 312. The absorptivity structures 404 may be located over device structures having different absorptivity. In addition, isolation structures about contact openings 402 may influence average absorptivities.

FIGS. 10A and 10B depict a further embodiment of absorptivity structures. Absorptivity structures 504 may be placed in etched regions of the device. As illustrated, capacitor 500 overlies and is integrated as part of a device 501. The capacitor 500 comprises an upper conductive portion 510, an insulation layer 512, and a lower conductive portion 514. Isolation structures 516 allow for contact with the lower conductive portion 514 while isolating layers 510 and 512. The capacitor 500 has contact openings 502 and absorptivity structures 504. FIG. 10B depicts a side view of these structures at a location indicated by Line D of FIG. 10A. The absorptivity structures 504 are inlaid into at least one layer of the capacitor 500. The structures 504 may be similar in shape to contact openings 502. However, the absorptivity structures may not provide access for contact with lower substrate layers. Contact structures, such as structure 502, may be formed by subsequent etching and masking steps. In one embodiment, the inlayed absorptivity structure 504 may be equivalent to the capacitive structures in length along Line D.

Figure 11:
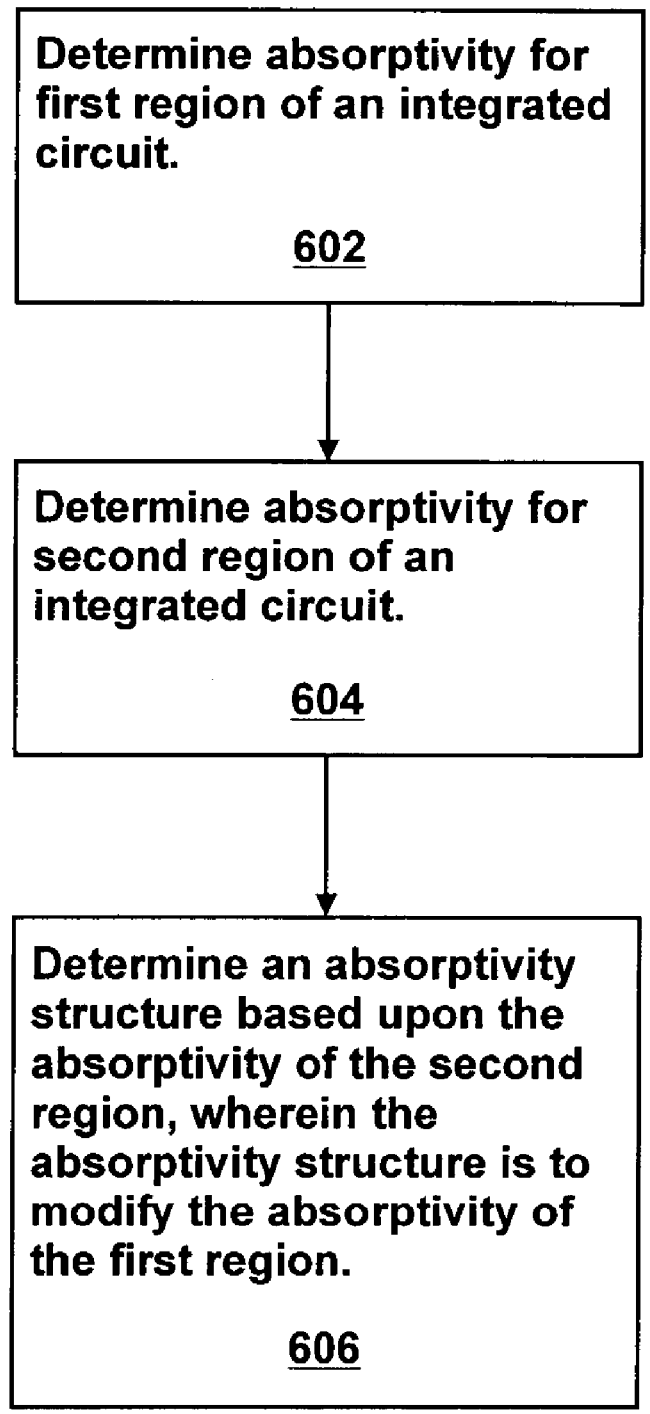
FIG. 11 is a flow diagram of a method depicting an exemplary method for designing temperature-controlling structures.

FIG. 11 depicts a method in accordance with the disclosure. At a step 602, a first absorptivity is determined for a first region of an integrated circuit. This determination may be through simulation, experimentation, or empirical understanding of the material and integrated circuit layout. The simulation may, for example, determine absorptivity in a region using known absorptivities of materials and the design layout. Alternately, the absorptivity may be determined though measurement or by empirical understanding. At a step 604, a second absorptivity is determined for another region of the integrated circuit. Similarly, this determination may be through simulation, experimentation, or empirical understanding of the material and integrated circuit layout. Subsequently, an absorptivity structure is determined as seen in step 606 based upon the second absorptivity. The absorptive structure can be used to alter the absorptivity of the first region. This absorptivity structure can alter the absorptivity of a region such that it more closely matches that of another region. In this manner, the energy absorption and, as a result, the temperature in a given region can be controlled, reducing variance during rapid thermal processing. The absorptivity structure can act to increase the average absorptivity of low absorptive regions such as large capacitors with large exposed polysilicon surfaces. Alternately, the adsorptive structure can be used to decrease the absorptivity of a region having excess high absorptivity surfaces. Further, the absorptivity structure can be used to create a difference in absorptivity to purposefully cause differences in device characteristics.

It will be appreciated that an absorptivity structure has been described. In view of the above detailed description of the present invention and associated drawings, other modifications and variations will now become apparent to those skilled in the art. It should also be apparent that such other modifications and variations can be effected without departing from the spirit and scope of the present disclosure. However, various embodiments and layouts of absorptivity structures may be envisaged. As such, these structures may surround, overlay, and comprise inlays in other devices, surfaces, and materials. Alternately, absorptivity structures may be used to purposely increase temperature variance to facilitate differences in device characteristics.

What is claimed is:

1. A method comprising:
   determining a first absorptivity of a first region of an integrated circuit;
   determining a second absorptivity of a second region of the integrated circuit; and
   determining a structure to overlay at least a portion of the first region to obtain a third absorptivity of the first region based on the second absorptivity.

2. The method of claim 1, wherein the first absorptivity and third absorptivity are average absorptivities.

3. The method of claim 2, wherein the second absorptivity is an average absorptivity.

4. The method of claim 1, wherein the third absorptivity is between the first absorptivity and the second absorptivity.

5. The method of claim 1, wherein the structure comprises higher absorptivity material than the region it overlays.

6. The method of claim 1, wherein the structure comprises lower absorptivity material than the region it overlays.

7. The method of claim 1, wherein determining the absorptivity of the first region and determining the absorptivity of the second region comprises simulating the absorptivity.

8. The method of claim 1, wherein determining the absorptivity of the first region and determining the absorptivity of the second region comprises empirically determining the absorptivity.

9. The method of claim 1, wherein the first absorptivity, second absorptivity and third absorptivity are temperature absorptivities.

10. A method comprising:

forming a device comprising a first surface material viewable from a plan view adjacent to a second surface material viewable from the plan view, the first surface material comprising a first temperature absorptivity, the second surface material comprising a second temperature absorptivity, the device comprising a first average temperature absorptivity;

forming a layer of a third material comprising a third temperature absorptivity overlaying the device; and etching the layer to form an temperature absorptivity structure overlaying a portion but not all of the the first and second surface materials of the device to obtain a second average temperature absorptivity of the device different from the first average temperature absorptivity.

11. The method of claim 10, wherein the second average temperature absorptivity is greater than the first average temperature absorptivity.

12. The method of claim 10, wherein the second average temperature absorptivity is less than the first average temperature absorptivity.

13. The method of claim 10, wherein the temperature absorptivity structure overlays portions of the first surface material.

14. The method of claim 10, wherein the temperature absorptivity structure overlays portions of the second surface material.

15. The method of claim 14, wherein the temperature absorptivity structure overlays portions of the first surface material.

16. The method of claim 10, wherein the first material comprises polysilicon.

17. The method of claim 16, wherein the third material comprises silicon nitride.

18. The method of claim 10, wherein the third material comprises silicon nitride.

19. The method of claim 10, wherein the device comprises a capacitor.

20. The method of claim 10 further comprising:

exposing the region to a rapid thermal anneal when the device has the second average temperature absorptivity.

21. A method comprising:

forming a region overlying a semiconductor substrate comprising a first surface material viewable from a plan view adjacent to a second surface material viewable from the plan view, the first surface material comprising a first absorptivity, the second surface material comprising a second absorptivity, the region comprising a first average absorptivity;

forming a layer of a third material comprising a third absorptivity overlaying the region;

etching the layer to form a third surface material viewable from the plan view overlaying a portion but not all of the first and second surface materials of the region to obtain a second average absorptivity of the region different from the first average absorptivity; and performing a rapid thermal anneal at the region having the second average absorptivity.

* * * * *